United States Patent [19]

Ward

[11] 4,350,980

[45] Sep. 21, 1982

[54] ELECTRIC METER CONSUMPTION AND DEMAND COMMUNICATOR

[75] Inventor: Steven M. Ward, El Paso, Tex.

[73] Assignee: Energy Optics, Inc., Las Cruces, N. Mex.

[21] Appl. No.: 123,216

[22] Filed: Feb. 21, 1980

[51] Int. Cl.[3] ............ G08C 9/06; H04Q 9/10

[52] U.S. Cl. ............ 340/870.02; 340/310 A; 340/870.29

[58] Field of Search ............ 340/870.02, 870.29, 340/310 A, 310 R

[56] References Cited

U.S. PATENT DOCUMENTS

| | | | |
|---|---|---|---|
| 2,176,720 | 10/1939 | Rayner et al. | 340/870.02 |
| 3,083,357 | 3/1963 | Chapin et al. | 340/870.29 |
| 3,311,824 | 3/1967 | Pitt | 340/870.29 |
| 3,609,754 | 9/1971 | Riebs | 340/870.29 |
| 3,846,789 | 11/1974 | Germer et al. | 340/870.02 |
| 4,040,046 | 8/1977 | Long et al. | 340/310 CP |
| 4,119,948 | 10/1978 | Ward et al. | 340/870.02 |
| 4,213,119 | 7/1980 | Ward | 340/151 |
| 4,264,897 | 4/1981 | Farnsworth | 340/870.29 |

*Primary Examiner*—Donald J. Yusko

[57] ABSTRACT

An electric power consumption communicator system which includes a non-contact electric utility meter monitoring device which converts meter wheel revolutions into electronic digital pulses. An encoder device converts the digital pulses to coded electronic oscillations which are coupled onto existing power lines at the meter location. The existing power lines provide the medium for communicating coded meter intelligence to all existing power outlets in a residence or building. One or more signal decoders located at any power outlet decouple and reconstruct the coded meter intelligence into a digital format conducive to further processing.

13 Claims, 5 Drawing Figures

2
AC POWER LINE
3
TRANSFORMER 25
TRANSFORMER 36
DC POWER SUPPLY
23
COUPLER CIRCUIT
24
28,30,32
METER PULSES
22
21
PULSE INITIATOR
10
POWER
20
METER DISK
6
ELECTRIC METER
7
DC POWER SUPPLY
50
DECOUPLER CIRCUIT
SIGNAL DECOUPLER
43,45,46
40
41

ELECTRIC METER CONSUMPTION AND DEMAND COMMUNICATOR

BACKGROUND OF THE INVENTION

Related Applications

The present application relates to generally similar subject matter disclosed in my co-pending application, Ser. No. 6/123217, for Load Control System for Standard Electric Utility Meter, concurrently filed herewith.

Field of Invention

This invention relates generally to an electro-optical system which scans the eddy current disk, also referred to as the meter wheel, of a standard electric meter and generates digital pulses in direct proportion to electricity consumption. The digital pulses are induced onto the electric power cables in the electric meter to provide meter data at all existing power outlets in a residence or building. Signal decoders, located at any convenient power outlet, provide meter intelligence which is available for digital processing for load control, demand monitoring, and consumption monitoring systems without the necessity for additional communication cabling.

Description of Prior Art

Due to the vast importance associated with energy conservation, new technology is needed to allow each consumer of electric power to manage his power consumption in an efficient manner. For a typical residential consumer, the only visible measure of indication of his own electric consumption is at the electric meter. A consumer can monitor the meter wheel, time each revolution and integrate revolutions over specific time periods in order to determine current demand, integrated demand and projected consumption over a billing period. However, the physical location of most electric meters precludes such actions on a continuing basis as a practical matter. As a result, new products have been introduced that automatically provide and process electric consumption intelligence at locations within a metered residence or building that allow the consumer the convenience of monitoring and managing electric consumption. Such intelligence allows the consumer the option of implementing automatic load control techniques, manually controlling comsumption based on knowledge of demand state, or managing consumption based on a knowledge of accumulated consumption. Such systems known in prior art include a system for sensing current input at the circuit breaker box, processing such information, displaying accumulated utility bills and providing an option for automatic load inhibiting when demand exceeds a selected threshold which is seen in U.S. Pat. No. 4,147,978. Even though such systems are available on the market, no system has found consumer acceptance on a large scale. The primary drawbacks to such systems reside in the method of sensing power consumption and in excessive unit costs including the installation of cabling within the residence or building which is required for communicating meter intelligence to the point for processing that information. Consumer acceptance is further limited since many consumers object to the installation of the required cabling regardless of the cost.

The method of sensing power consumption by prior art systems lies in the use of loop current transformers which are installed in the proximity of the input power line in order to sense the surrounding electro-magnetic field and provide an analog voltage level proportional to current throughput. Such voltages are monitored by analog voltage comparitors in order to determine when power demand exceeds preselected threshold values. The analog nature of this monitoring technique limits long-term reliability generating system vulnerability to improve sensor installation, long-term voltage drift and power line transient impulses.

SUMMARY OF THE INVENTION

It is therefore a primary object of this invention or provide a low cost approach of collecting and communicating electric utility meter intelligence for consumers which avoids data communication cable installation and overcomes the aforementioned and other disadvantages and limitations.

It is a further object of this invention to provide a highly reliable digital technique for generating electric utility meter intelligence.

It is a still further object of this invention to provide coupling and decoupling system which allows distribution of electric utility meter intelligence over existing power lines.

It is a still further object of this invention to provide digital pulses whose numbers are in direct proportion to electricity consumption at any point in a residence or building where there is located a power outlet or power switch.

According to the present invention, the foregoing and other objects are attained by providing an electro-optical meter wheel scanner device for generating digital pulses which represent known measures of electric power consumption, a circuit which generates signal bursts of high frequency electronic oscillations corresponding to each digital input pulse and couples this signal onto the existing power line at the electric utility meter and a decoupler circuit which plugs into any available power outlet on the metered premises and responds to the distributed signals regenerating the digital meter pulses. Once transmitted throughout the metered premises, meter intelligence is available for processing by systems providing for power demand indicators, automatic load control and utility billing accumulation and display. The present invention is directed toward overcoming technical limitations of prior art by providing a low cost yet highly reliable digital technique for generating electric meter intelligence and by providing a power line distribution means for transmitting meter intelligence to convenient locations within a metered premises.

The system according to the present invention utilizes a light emitter/detector pair mounted inside any standard electric meter to generate digital pulses proportional to the number of meter wheel revolutions. Each digitalpulse generated is used to activate a high frequency oscillator which oscillates at a programmed frequency. The oscillator output is a transformer coupled onto the primary AC power line which carries the signal throughout the metered premises. An appropriate decoupler circuit which is directly plugged into a convenient power outlet, detects the transmitted signal and reconstructs the digital pulses providing meter intelligence for many optional processing systems.

It should be noted that the present invention is a communication system which operates in an environment where electric meters, power lines and power outlets are known to exist. Although the electric meter consumption communicator system monitors electric meters and utilizes the existing power lines which electrically connect the electric meter to all existing power outlets in a residence or building as a communication medium, it should be made clear that neither the existing electric meters, the power lines, the power outlets, the residence or the building are considered as a part of this invention.

It is therefore an aspect of the present invention to provide an electric meter consumption communicator system which interacts with an environment known to include a residence or building, an electric meter with a consumption indicator, power lines and power outlets which comprises a first arrangement monitoring the electric meter consumption indicator and generating a plurality of digital meter pulses with each pulse representing a predetermined quantity of electric power consumed. A second arrangement extracts power from the existing power lines, provides power to the first arrangement, generates signals corresponding to the digital pulses formed by the first arrangement and couples the signals onto the existing power lines. A third arrangement decouples the signals generated by the second arrangement from the power lines at a power outlet and converts the signals to digital pulses restoring meter pulses to their original form.

A still further aspect of the present invention resides in providing a system for communicating electric meter intelligence of primary power consumption of electricity flow therethrough over secondary power lines having a plurality of existing power outlets, comprising a first arrangement associated with the meter effective to generate digital pulses in a proportional relationship to the electric current flow through the primary line. A second arrangement connected to the first arrangement which couples signals corresponding to the digital pulses generated by the first arrangement onto secondary power lines. A third arrangement connected to a power outlet decouples signals generated by the second arrangement from the secondary power lines and restores the signals to their original digital format.

For a better understanding of the present invention, together with other and further objects thereof, reference is had to the following description taken in connection with the accompanying drawing, and its scope will be pointed out in the appended claims.

DETAILED DESCRIPTION OF THE INVENTION

Figure 1:
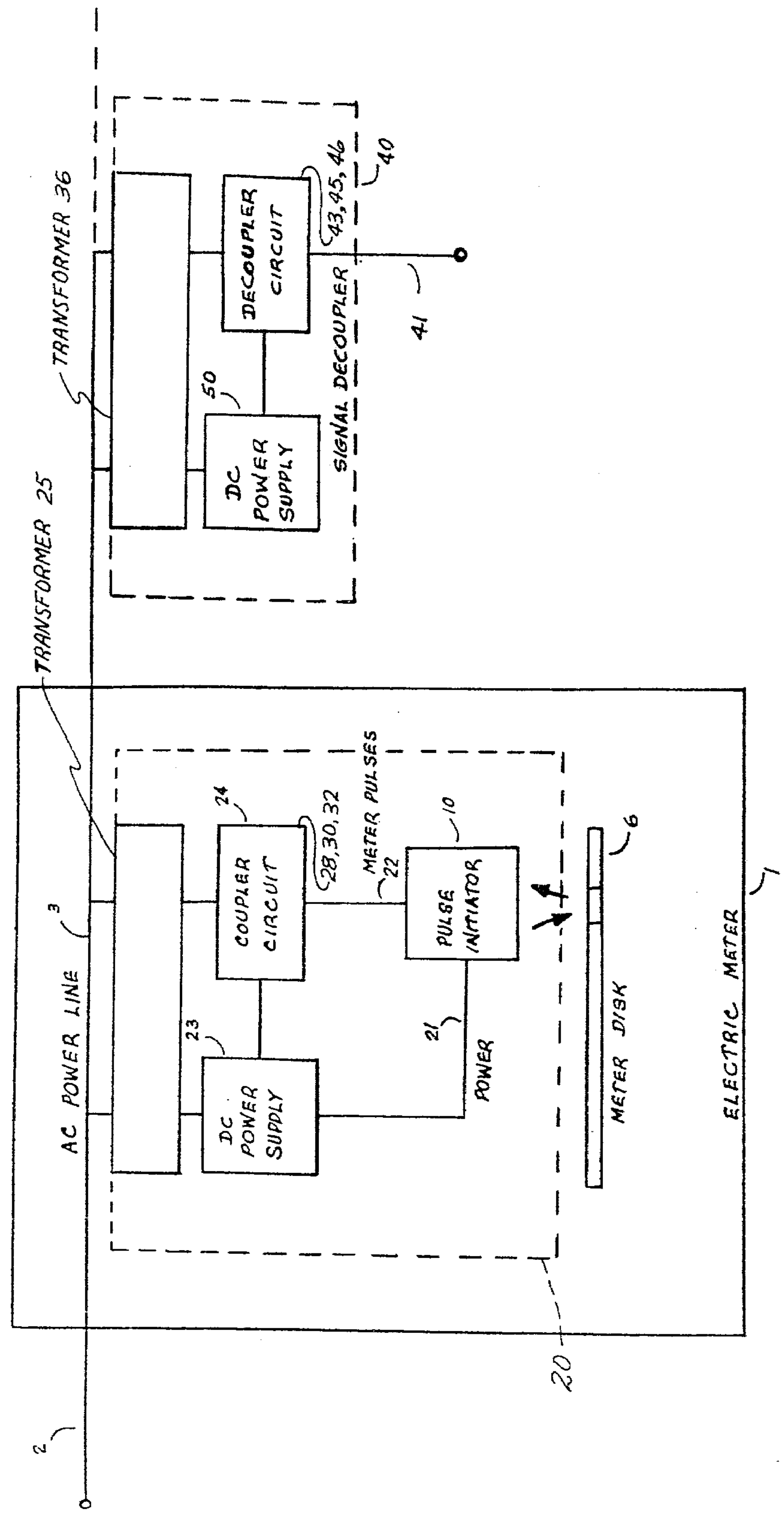
FIG. 1 is a system block diagram illustrating the electric meter consumption communicator system in accordance with the present invention.

Referring now to FIG. 1, the electric meter consumption communicator system for electric utility meters of the present invention comprises three major subsystems, including an electro-optic pulse initiator 10, a signal coupler 20, and a signal decoupler 40. The electro-optical pulse initiator 10 and the signsl coupler 20 can be constructed if desired to be placed within the conventional confines of standard electric watt hour meter 1 together these two subsystems are referred to as power line encoder-coupler circuit, see FIG. 3A. The electro-optical pulse initiator 10 includes an infra-red light emitter/detector pair which monitors the meter wheel 6 in order to convert meter wheel revolutions into digital pulses hereafter referred to as meter pulses 22. Each pulse represents a known quantity of electric power consumption or of electric current throughput. The signal power line coupler 20 and decoder circuit, see FIG. 3B provides two basic functions. First, included in the signal coupler 20 is a DC power supply 23, which converts the AC power available within the meter to DC power 21 which supplies the electro-optical pulse initiator 10. Second, the signal coupler 20 includes a coupling circuit 24 which is effective to induce meter pulses 22 onto the existing AC power line 3 within the meter. The existing AC power line 3 provides a medium for communicating meter pulses throughout the metered residence or building. Since the existing AC power line is known to provide an electrical connection to all existing power outlets and power switches within a metered residence or building, metal pulses are then communicated to any convenient power outlet or power switch. The signal decoupler 40 can then be plugged into any existing power outlet extracting meter pulses from the AC power line and regenerating the meter pulses 41 into their original digital format. Therefore, the signal decoupler 40 provides meter intelligence at any convenient location within a metered residence or building.

Electro-Optic Pulse Initiator

Figures 2A, 2B:
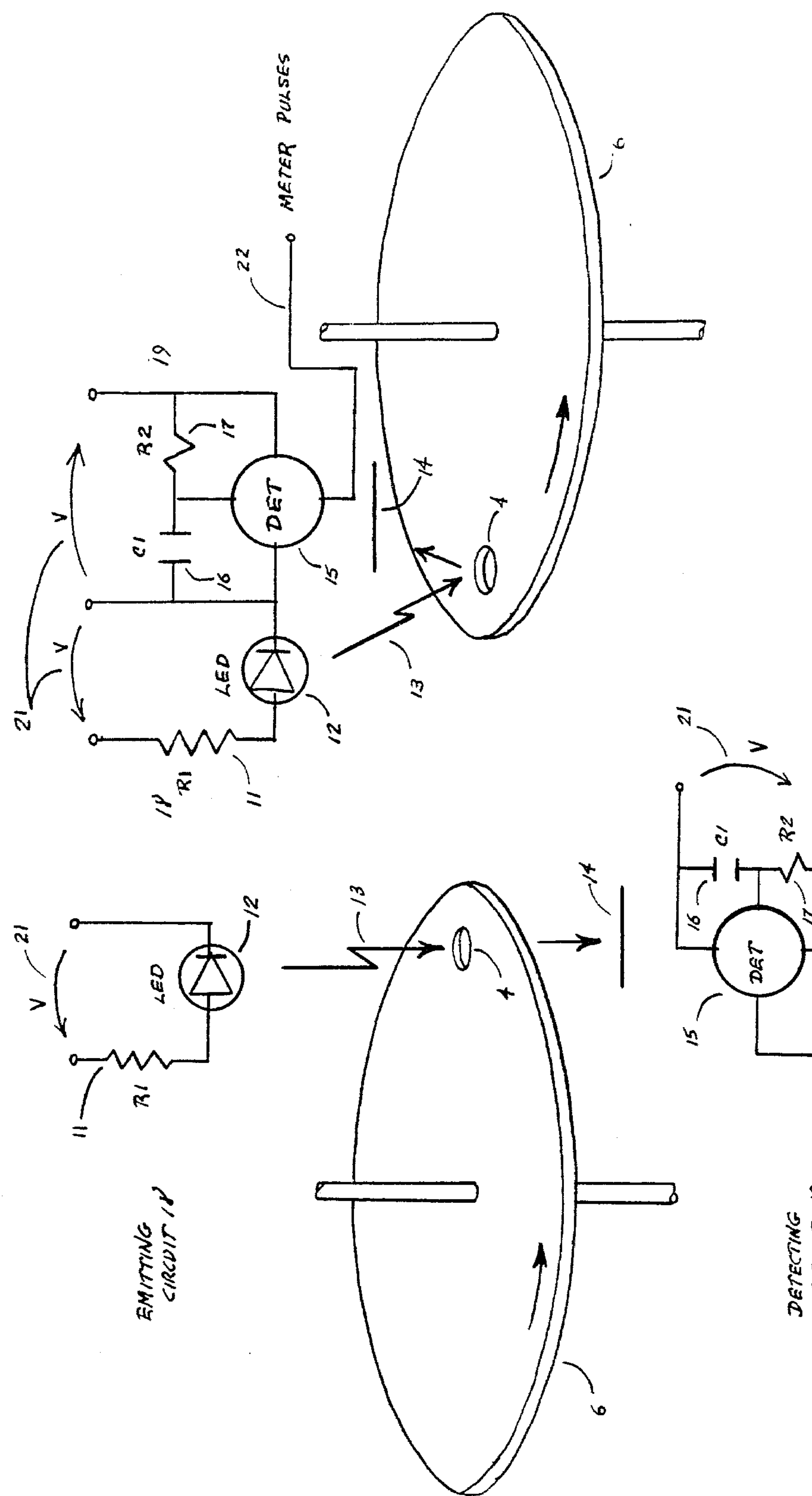
FIG. 2A is a schematic representation of the meter wheel scanner showing the transmissive detection mode.
FIG. 2B is a representation similar to FIG. 2A showing the reflective detection mode.

The electro-optical pulse initiator 10 is hereafter described in reference to FIGS. 2A and 2B. Essentially, every standard electric watt hour meter 1 includes an eddy current disk 6 which revolves at a rate proportional to current throughput. Therefore, each disk 6 revolution or half revolution represents a known measure of metered power consumption. Anti-creep holes 4 in the disk 6 are also typical of standard electric meters, since they are requied to preclude disk revolution during power outages. The electro-optical pulse initiator 10 monitors the passage of each hole 4 to produce the necessary meter pulses 22 in a manner similar to the device shown in FIG. 5A of U.S. Pat. No. 4,119,948 issued to the present applicant as coinventor. The pulse initiator 10 includes a light emitting circuit 18 and a light detecting circuit 19. The emitting circuit 18 comprises a current limiting resistor R1 11 in a series with a light emitting diode (LED) 12 powered by a DC voltage 21. The LED 12 emits infra-red light 13 (typically 940 Nanometers in wavelength), continuously. The detector circuit 19 comprises a detector diode (DET) 15 which includes an integrated amplifier, not shown, within a single component housing. A typical component of this type is a Feranti ZNP103. The detector circuit 19 provides a standard digital output 22 for the duration that light 13 from the LED 12 is received. The integrated detector 15 is coupled to an external resistor R2 17 and capacitor C1 16 whose values determine the sensitivity of the detector 15. The detector circuit 19 is also powered by voltage 21 from the DC power supply 23.

The emitter and detector circuits are physically arranged to allow either transmissive detection, see FIG. 2A, or reflective detection, see FIG. 2B, of the anti-creep holes in the disk 6. In the reflective mode, the pulse initiator 10 can also detect the passage of either reflective or absorptive stripes on the disk. In the preferred embodiment, however, in the transmissive mode, the emitter and detector components are located on opposite sides of the disk 6, so that passage of anti-creep holes 4 will allow light 13 from the emitter circuit 18 to be transmitted to the detector circuit 19. In the reflective mode, the emitter and detector components are located on the same side of disk 6 so that reflected light 13 is continuously detected except when the anti-creep hole 4 passes through the emitted beam 13. In both the reflective and transmissive modes or operation, light entering the detector is filtered by an optical band pass filter 14 whose center wavelength corresponds to the wavelength of the infra-red emitter 12 in order to block ambient light and improve the false alarm rate. In either case, the detector circuit 19 generates either a positive or negative logic digital pulse 22 for each hole 4 passage which represents a known measure of metered power consumption.

Power Line Coupler

Figure 3A:
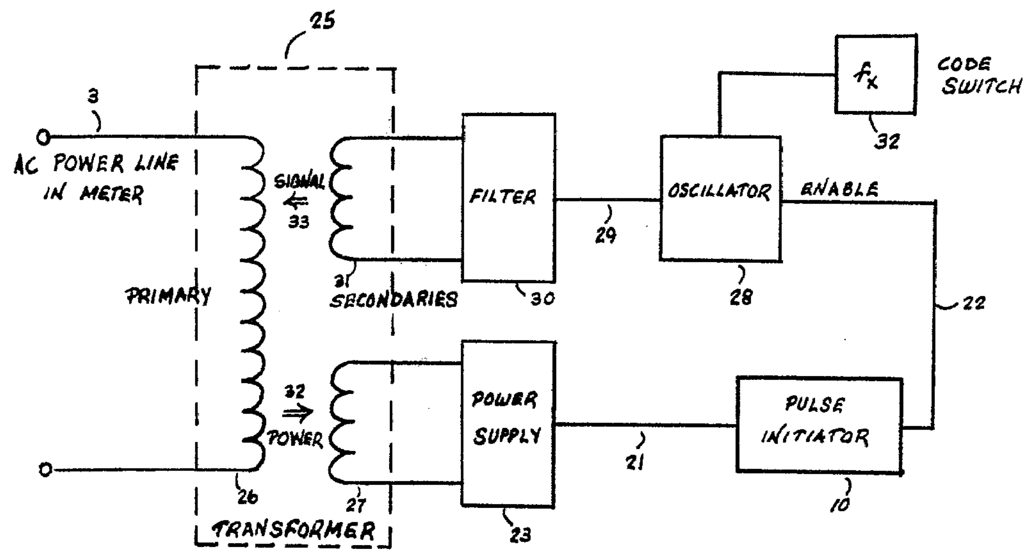
FIG. 3A is a schematic block diagram showing the system power supply and power line coupler.
Figure 3B:
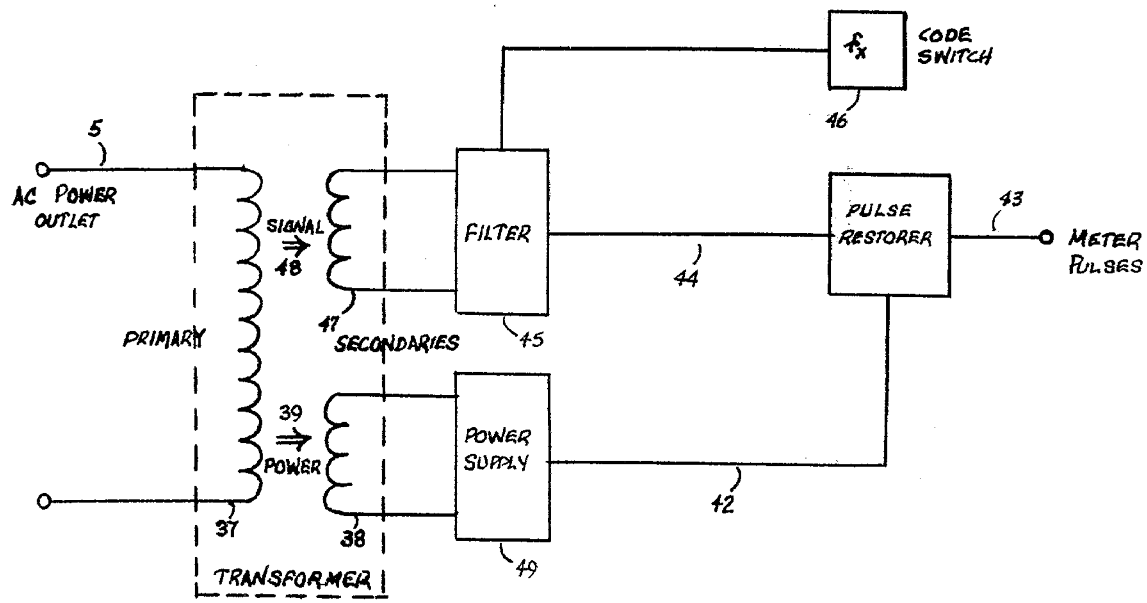
FIG. 3B is a representation similar to FIG. 3A showing power line decouplers.

The power line coupler 20 is hereafter described in reference to FIG. 3A. The power line coupler is located within the confines of a standard electric meter and interfaces with the AC power line 3 available in the meter in order to provide two primary functions. First, the power line coupler 20 must extract power from the power line in order to provide DC power 21 to the electro-optical pulse initiator 10. Second, the power line coupler must be effective to induce meter pulses 22 onto the main power line 3 for communication throughout the metered residence or building. Many techniques are available for inducing meter pulses onto the power lines including wrapping signal wiring around the main power bus, installing current or loop transformers, electro-optical coupling, and coupling short duration short circuit pulses. However, the power line coupler 20 design of the preferred embodiment is based on a standard transformer 25 with a single primary 26 and dual independent secondaries 31 and 27. Power 32 is coupled from the primary 26 of the transformer 25 to the secondary 27. This power is converted to the required DC power 21 which powers all the circuitry located within the meter by DC power supply 23. Meter pulses 22 generated by the electro-optical pulse initiator 10 are effective to enable oscillator 28 which oscillates at a selected frequency $F_x$ (typically 100 k Hz) for the duration of the meter pulse. The specific oscillating frequency $F_x$ is selected by a rotary switch 32 which determines the value of resistive and capacitive oscillator components (not shown). The rotary switch 32 provides a simple means of signal coding since a single oscillating frequency can be selected for each thumbwheel setting. In this manner, systems installed in adjacent residences sharing the same power line can operate on different codes without mutual interference. Therefore, the oscillator 28 provides a burst of electronic oscillation 29 which corresponds to the input meter pulses 22. The oscillating signal 29 passes through a high band pass filter 30 and it is induced onto the secondary 31 of the transformer 25. The signal 33, therefore, is transformer coupled onto the AC power line 3 through the primary 26 of the transformer 25. The high pass filter 30 is required in order to block the 60 Hz signal which is coupled from the AC power line 3 through transformer 25 to the secondary 31 while passing the high frequency signal 29 in the opposite direction. As a result of this process, bursts of high frequency oscillations which correspond directly to meter pulses 22 are induced onto the power line 3 and transmitted throughout the metered residence or building.

Power Line Decoupler

The power line decoupler circuit 40 is hereafter described with reference to FIG. 3B. As previously described, signals 33 representing meter pulses 22 are induced onto the AC power line and transmitted throughout the metered residence or building. The power line decoupler module 40 is then connected to any available AC power outlet 5 in order to extract the signal 33 from the power line 3. Directly across the AC power outlet 5 is connected the primary 37 of a transformer 36. Dual secondaries provide for coupling power and signals from the power line. AC power 39 is coupled from the primary to secondary 38 in order to drive a DC power supply 50. This supply provides DC power 42 for the circuiry located in the power line decoupler 40. The high frequency signal 48 is coupled from the primary 37 to the secondary 47 and is passed through a band pass filter 45 which passes only the high frequency signal 48 and blocks the 60 Hz AC signal. The band width of the band pass filter 45 is selected to pass only the desired signal frequency 48. A rotary switch selector 46 is connected through the band pass filter in order to select resistive, inductive and capacitive filter components (not shown), which tune the center frequency of the band pass filter 45 to accept only the desired signal. In this manner, the frequency coded signal 33 is decoded or accepted by the decoupler 40 as long as the thumbwheel setting (not shown) of switch 46 matches the corresponding thumbwheel (not shown) setting on the coupler unit 20. The desired signal 44 is then coupled to a pulse restorer circuit 49 which regenerates the digital meter pulses 43. The pulse restorer circuit 49 includes well-known circuitry for rectifying the high frequency oscillation in order to create a DC trigger level which triggers a monostable multi-vibrator. The output of the monostable multi-vibrator is a digial pulse 43 which directly corresponds to the meter pulse 22 which was generated at the electric utility meter 1.

While there have been described what are at present considered to be the preferred embodiments of this invention, it will be obvious to those skilled in the art that various changes and modifications may be made therein without departing from the invention, and it is aimed, therefore, in the appended claims to cover all such changes and modifications as fall within the true spirit and scope of this invention.

What is claimed is:

1. An electric meter comsumption and demand communicator system for use with a Watt hour utility meter of the rotational disc type, for metering an AC power line, said communicator system comprising in combination:

power line encoder-coupler circuit means for extracting power from the AC power line within the meter or adjacent thereto to establish a DC power source and including non-contact power consumption and demand monitoring means deriving current from said meter disc and pulse initiator means effective to generate electronic digital pulses in a predetermined relationship to the number of rotations of the disc, signal generator means electrically connected to said pulse initiator means for producing high frequency coded electric signals corresponding to said digital pulses and connecting to the AC power line of the meter system for inducing said signals upon said power line;

and power line decoder-decoupler circuit means connecting to said AC power line for extracting said high frequency electric signals and restoring said electric signals into digital pulses.

2. A system according to claim 1, wherein said encoder-coupler circuit means includes an electro-optic scanner circuit for monitoring the rotation of the disc.

3. A system according to claim 1, wherein said encoder-coupler circuit means generates oscillator output burst signals.

4. A system according to claim 3, wherein said encoder-coupler circuit means includes an oscillator and a frequency determining code switch for causing the oscillator to oscillate at a pre-selected coded frequency for the duration of the digital meter pulses.

5. A system according to claim 4, wherein said encoder-coupler circuit means includes a high band pass filter and a transformer and wherein the oscillating signals pass through the filter and through said transformer and are then induced onto the AC power line.

6. A system according to claim 1, wherein said decoder-decoupler circuit means includes transformer means having a primary winding coupled to said power line and two secondary windings, a DC power supply being coupled to one of said secondary windings and a band pass filter being coupled to the other secondary winding.

7. A system according to claim 6, and a pulse restorer coupled to said DC power supply of said decoder-decoupler circuit means.

8. A system according to claim 7, and a code switch connected to the filter of said decoder-decoupler circuit means for causing the filter to pass onto said restorer only predetermined signal frequencies.

9. A system according to claim 2, wherein said electro-optic scanner functions in the reflection detection mode.

10. A system according to claim 2, wherein said electro-optic scanner functions in the transmissive detection mode.

11. An electric meter consumption and demand communicator system for use with a Watt hour utility meter of the rotational disc type for metering an AC power line comprising in combination:

power line encoder-coupler circuit means including transformer means having a primary and at least two secondary windings, with the primary winding being adapted to connect to said AC power line, an AC to DC power converter connecting to one of said secondary windings for establishing a DC power source, the other secondary winding coupling to said primary winding, a circuit between the two secondary windings comprising pulse initiator means effective to generate electronic digital pulses in a predetermined relationship to the number of rotations of the disc, an oscillator effective to oscillate at a pre-selected frequency for the duration of said digital pulses and for establishing high frequency electric signals, a code switch for determining the frequency of the oscillation established by said oscillator, a high band pass filter effective to block signals from the AC power line while allowing said electric signals to be induced upon said AC power line;

and power line decoder-decoupler circuit means comprising transformer means having a primary winding connecting to said AC power line and at least two secondary windings with a circuit connected therebetween, an AC to DC power converter connected to one of said secondary windings to establish a DC power source, a filter connected to the other secondary winding for passing only said high frequency electric signals from said AC power line, a pulse restorer converting said high frequency signals into digital pulses and a frequency code switch cooperating with said filter.

12. An electric meter consumption and demand communicator system for use with a Watt hour utility meter of the rotational disc type for metering an AC power line comprising in combination:

power line encoder-coupler circuit means including transformer means having a primary and at least two secondary windings, with the primary winding being adapted to connect to said AC power line, an AC to DC converter connecting to one of said secondary windings for establishing a DC power source, the other secondary winding coupling to said primary winding, a circuit between the two secondary windings comprising a pulse initiator effective to generate electronic digital pulses in a predetermined relationship to the number of rotations of the disc, an oscillator effective to oscillate at a pre-selected frequency for the duration of said digital pulses and establishing high frequency electric signals, a code switch for determining the frequency of the oscillation established by said oscillator. a high band pass filter effective to block signals from the AC power line while inducing said electric signals upon said AC power line;

and power line decoder-decoupler circuit means connecting to said AC power line for extracting said high frequency encoded electric signals and restoring said electric signals into digital pulses.

13. An electric meter consumption and demand communicator system for use with a Watt hour utility meter of the rotational disc type for metering an AC power line comprising in combination:

power line encoder-coupler circuit means for extracting power from the AC power line within the meter or adjacent thereto to establish a DC power source and including non-contact power consumption and demands means deriving current from said source, placed adjacent to but spaced from said meter disc and effective to generate electronic digital pulses in a predetermined relationship to the number of rotations of the disc, a signal generator for producing high frequency coded electric signals corresponding to said digital pulses and coupling to the AC power line of the meter system for inducing said signals upon said power line;

and power line decoder-decoupler circuit means comprising tranformer means having a primary winding connecting to said AC power line and at least two secondary windings with a circuit connected therebetween, an AC to DC converter connected to one of said secondary windings to establish a DC power source, a filter connected to the other secondary winding for passing only said high frequency signals from said AC power line, a pulse restorer converting said high frequency signals into digital pulses and a frequency code switch cooperaing with said filter.

* * * * *